United States Patent
Parker

(10) Patent No.: US 9,478,303 B1
(45) Date of Patent: Oct. 25, 2016

(54) SYSTEM AND METHOD FOR MEASURING DATA RETENTION IN A NON-VOLATILE MEMORY

(71) Applicant: SanDisk Technologies Inc., Plano, TX (US)

(72) Inventor: Liam Michael Parker, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/699,388

(22) Filed: Apr. 29, 2015

(51) Int. Cl.
G11C 16/06 (2006.01)
G11C 16/34 (2006.01)

(52) U.S. Cl.
CPC .................... G11C 16/3418 (2013.01)

(58) Field of Classification Search
CPC ....... G11C 16/24; G11C 16/10; G11C 29/82; G11C 16/04; G11C 16/26; G11C 16/30; G11C 16/3404
USPC ........................................ 365/185.25, 185.29
See application file for complete search history.

(56) References Cited

U.S. PATENT DOCUMENTS

| 7,944,744 B2 | 5/2011 | Bryant-Rich |
| 2009/0268520 A1* | 10/2009 | Roohparvar ........ G11C 27/005 365/185.09 |
| 2009/0319722 A1 | 12/2009 | Murin et al. |
| 2013/0097368 A1 | 4/2013 | Murin et al. |
| 2016/0054937 A1 | 2/2016 | Tuers et al. |

* cited by examiner

*Primary Examiner* — Huan Hoang
(74) *Attorney, Agent, or Firm* — Brinks Gilson & Lione

(57) ABSTRACT

A non-volatile memory system may include a mechanism for analyzing and measuring/predicting data loss without reading data in memory cells of the non-volatile memory. The system may include a data management module that utilizes charge loss measurements of a reference charge device that is independent of the memory cells that are configured to store data. The measured charge loss may be correlated with a predetermined data loss profile for the non-volatile memory that corresponds with charge loss on the reference charge device. The method may include charging the reference charge device when the non-volatile memory system is being powered down and making the charge loss measurement, and estimating data loss, when the non-volatile memory system is later powered up. The non-volatile memory cells may be refreshed when the estimated data loss is above a predetermined threshold.

23 Claims, 9 Drawing Sheets

SYSTEM AND METHOD FOR MEASURING DATA RETENTION IN A NON-VOLATILE MEMORY

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. As the non-volatile memory cell scales to smaller dimensions with higher capacity per unit area, the cell endurance due to program and erase cycling, and disturbances (e.g. due to either read or program operation) may become more prominent.

The defect level during the silicon process may become elevated as the memory cell dimension shrinks and process complexity increases. Likewise, time and temperature may hinder data retention (DR) in a memory device. Increased time and/or temperature may cause a device to wear more quickly and/or lose data (i.e. data retention loss). Devices may be switched off for lengthy periods of time during which the data in the non-volatile memory can become more difficult to read therefore requiring greater amounts of error correction. Temperature cycling of a memory device while switched off can add to the data retention problems in non-volatile memory. In the worst case, the data is uncorrectable and therefore has been lost.

One typical approach for determining data retention status for a memory device is measurement of bit error rate (BER) through the scanning of individual memory cells. BER may be used as an estimate for wear, DR, or remaining margin; however, BER is merely the result of the problem and may not be an accurate predictor. Further, scanning the memory cells of a non-volatile memory device may be time consuming and, if done too frequently, may be detrimental to the stored data. Typical scanning of the data in memory cells for determining BER is also reactive in nature in that it detects problems that already exist.

BRIEF DESCRIPTION

Figure 1A:
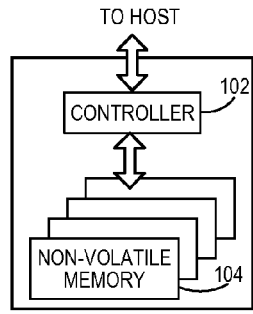
FIG. 1A is a block diagram of an example non-volatile memory system.

A system is described herein that can measure elapsed Kelvin time, which may also be referred to as the bake time a non-volatile memory device is subjected to at a particular temperature, corresponding to the effect elapsed time and/or temperature cycling has had on the underlying non-volatile memory system. This elapsed Kelvin time may provide a measure of Accelerated Retention Loss (ARL) of the data stored on the non-volatile memory device. Data retention may refer to either a gain or loss of charge over time in the non-volatile memory cells. Data may be lost if the charge gain/loss passes over a threshold voltage which then changes the value of the cell. An erase cycle may reset the charge for the cells in a block, which can correct the gain/loss of charge over time. Read disturb errors may be caused when cells in a memory block change over time (e.g. become programmed unintentionally). The act of a particular cell being excessively read may cause a read disturb error for neighboring cells. In particular, a cell that is not being read, may receive elevated voltage stress because a neighboring cell is being read. Charge may collect on floating gates, which may cause a memory cell to appear to be programmed when it is not. The read disturb error may result in a data loss. Error correction code (ECC) techniques may correct the error and an erase cycle can reset the programming of the cell.

By way of introduction, the below embodiments relate to systems and methods for estimating and correcting for data loss due to time and temperature cycling of a memory system. As set forth in greater detail below, the concept of determining and addressing data retention issues due to time and/or temperature changes that occur while a memory system is powered down by examining leakage current from a reference charge device is explained. Over time, data may be lost from a non-volatile memory (even at normal temperatures). At normal temperatures, electrons may leak over time from the floating gates of memory cells, such as NAND non-volatile memory cells, and increases in temperature can act to speed up that leakage. As used herein, the term data loss is intended to refer to degradation of data, for example in terms of the amount of bit errors that are predicted to have accumulated or actually accumulated in the blocks of memory cells of a storage system. While bit errors do represent a type of loss of data, the error correction code (ECC) of a storage system is designed to recover that data if the number of bits in error are within the correction capability of the particular ECC engine available in the storage system. Permanent data loss, in the form of an uncorrectable error, sometimes referred to as an uncorrectable ECC or UECC error, that is beyond the capability of the ECC engine to correct for, is sought to be reduced or avoided utilizing the methods and systems disclosed herein.

In one embodiment, a method for predicting data retention loss includes storing an electric charge on a charge storage device in a memory system having a plurality of non-volatile memory cells, where the charge storage device is separate from the plurality of non-volatile memory cells and has a predetermined rate of charge loss. Periodically, the amount of charge loss in the charge storage device is measured and a data loss level is determined for the of memory cells in the non-volatile memory system based on the amount of charge loss in the charge storage device without reading data from the memory cells.

In some embodiments the charge storage device includes a plurality of charge storage circuits, where each of the charge storage circuits is configured to exhibit a different predetermined rate of charge loss. In these embodiments, periodically measuring the amount of charge loss may include selecting a charge storage circuit from the plurality of charge storage circuits, measuring the amount of charge loss in the selected charge storage circuit, and determining the data loss level for the plurality of memory cells based on the measured amount of charge loss in the selected charge storage circuit. Determining the data loss level may include determining an estimated bit error rate for the memory cells. The method may include refreshing the plurality of memory cells in the memory in response to the determined data loss level reaching a predetermined threshold.

In another embodiment, a method for predicting data retention loss includes, in response to detecting a power down operation at a non-volatile memory system having a plurality of memory cells, charging a charge storage device in the non-volatile memory system to a fully charged state, where the charge storage device is separate from the plurality of memory cells in the non-volatile memory system and is configured to have a predetermined rate of charge loss. Upon a power up of the non-volatile memory system, an amount of charge loss at the charge storage device is measured. The amount of charge loss corresponds to a difference between the fully charged state and a state of charge detected at the power up. A bit error rate for the memory cells is estimated based on the measured amount of charge loss at the charge storage device.

In different implementations of this embodiment, the charge storage device may consist of a plurality of charge storage circuits, with each of the plurality of charge storage circuits having a different predetermined rate of charge loss. Periodically measuring the amount of charge loss may then include selecting a charge storage circuit from the plurality of charge storage circuits, measuring the amount of charge loss in the selected charge storage circuit, and then determining the data loss level for the plurality of memory cells based on the measured amount of charge loss in the selected charge storage circuit.

In yet another embodiment, a non-volatile memory system includes a non-volatile memory having a plurality of non-volatile memory cells. The non-volatile memory system further includes a reference charge device having at least one charge storage circuit configured to leak a charge stored on the reference charge device at a predetermined rate. The non-volatile memory system also may include a controller having a data loss management module configured to charge the reference charge device to a fully charged condition. The data loss management module may also be configured to measure a remaining charge on the charge storage device in response to detecting a data loss measurement trigger and to estimate a data loss condition of the non-volatile memory based on the measured remaining charge independent of reading any data from the non-volatile memory. When the estimated data loss condition satisfies a predetermined threshold, the data loss management module may refresh the plurality of memory cells in the non-volatile memory to avoid data loss. In some implantations, the reference charge device is positioned in the controller, while in others the reference charge device is positioned on a non-volatile memory die in the non-volatile memory, or in both the non-volatile memory die and the controller.

In some embodiments, the reference charge device comprises a plurality of charge storage circuits, each of the plurality of charge storage circuits having a different charge capacity.

In some embodiments, the memory is a three-dimensional memory and/or the memory system is embedded in a host or is removably connected to a host.

Other embodiments are possible, and each of the embodiments can be used alone or together in combination. Accordingly, various embodiments will now be described with reference to the attached drawings.

Exemplary Embodiments

Figure 1B:
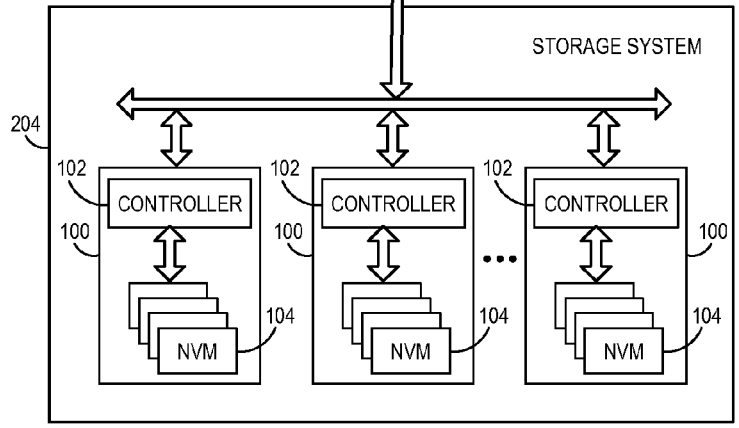
FIG. 1B is a block diagram illustrating an exemplary storage module.
Figure 1C:
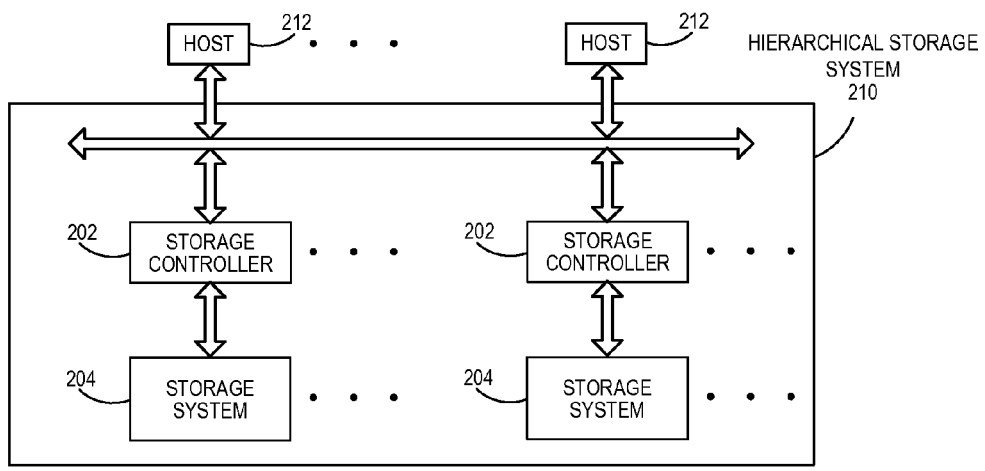
FIG. 1C is a block diagram illustrating a hierarchical storage system.

Examples of suitable non-volatile memory arrangements in which the systems and methods disclosed herein may be used are illustrated in FIGS. 1A-1C. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
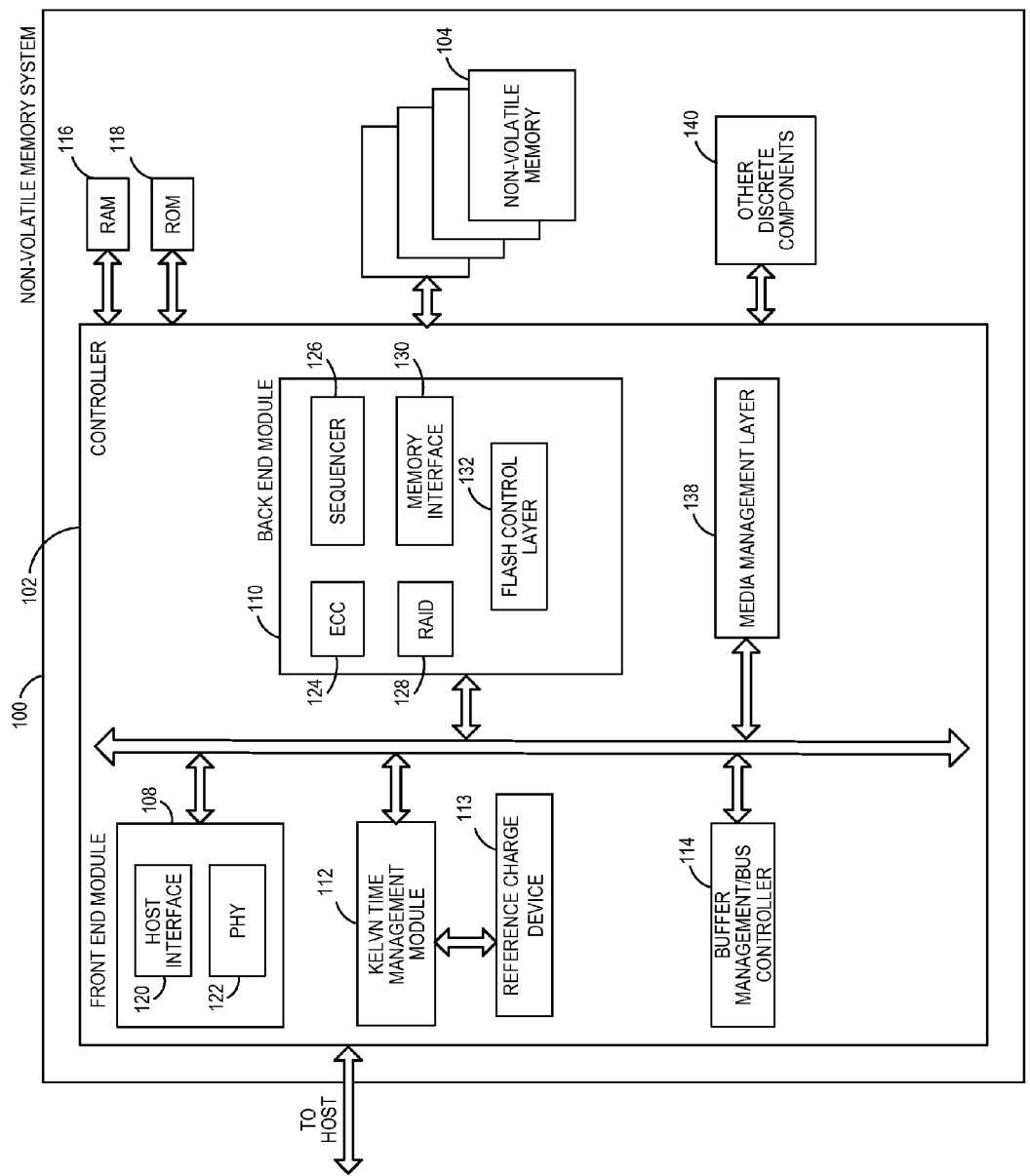
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

Each module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a Kelvin time management module 112 present on the die of the controller 102. As explained in more detail below, the Kelvin time management module 112 may handle the determination and management of data loss from elapsed time and/or temperature cycling effects on a non-volatile memory system while it is powered down or, in some embodiments, the effect of time or temperature on the non-volatile memory system while it is operating (powered on). The Kelvin time management module 112 takes voltage measurements of a reference charge device 113 to measure charge leakage rather than specifically tracking an elapsed time or measuring temperature directly. The Kelvin time management module 112 handles the determination of when memory cells in the non-volatile memory 104 die need to be refreshed to avoid data loss or corruption.

The elapsed Kelvin time determination (essentially the bake time at a particular temperature) corresponds to the effect that both any elapsed time and/or temperature cycling has had on the underlying non-volatile memory, and thus gives a measure of Accelerated Retention Loss (ARL) of the data stored on the device. Rather than attempt to measure actual time, or to scan the individual memory cells in the non-volatile memory for effects from time elapsed and/or temperature, a reference charge device 113 not involved in storing data is used. These reference charge device 113 can be either within the controller 102 as shown in FIG. 2A, embedded with the non-volatile memory die 104 (See FIG. 2B) or located in both. In one embodiment, the reference device 113 may only be located in the controller 102 or only located in the non-volatile memory die 104. The reference charge devices 113 are designed such that they leak charge in a manner that is correlated to the behaviour of the underlying non-volatile memory, but are separate from the memory cells in the non-volatile memory. By separating the reference charge device that is used to detect a Kelvin time from the data storage cells, the charge leakage used to detect the Kelvin time will not be influenced by program and erase cycle activity that affects the data storage cells in the non-volatile memory. As used herein, elapsed Kelvin time refers to a joint measure of elapsed time and/or temperature cycling.

Figure 2B:
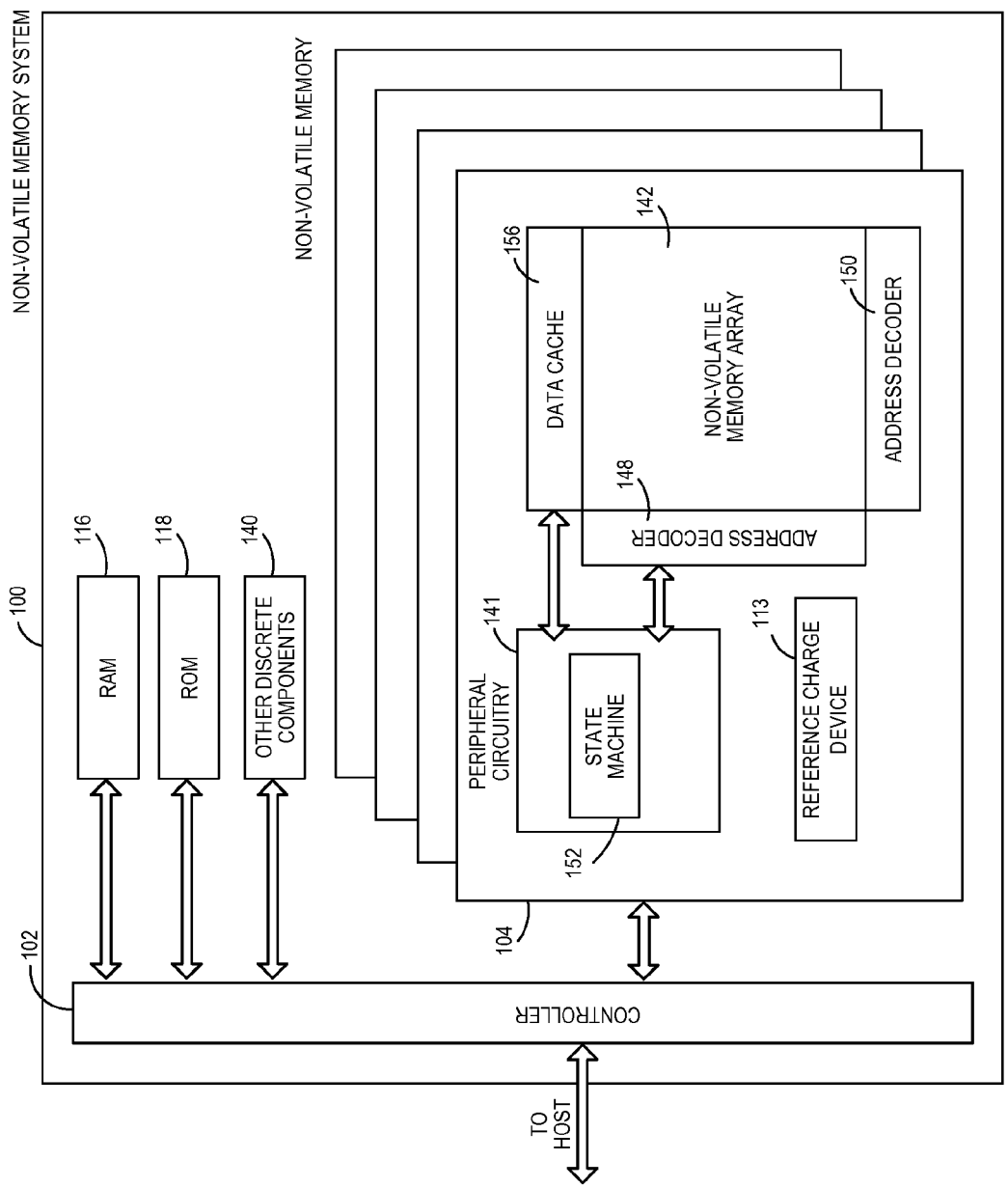
FIG. 2B is a block diagram illustrating exemplary components of a non-volatile memory of a non-volatile memory storage system.
Figure 2C:
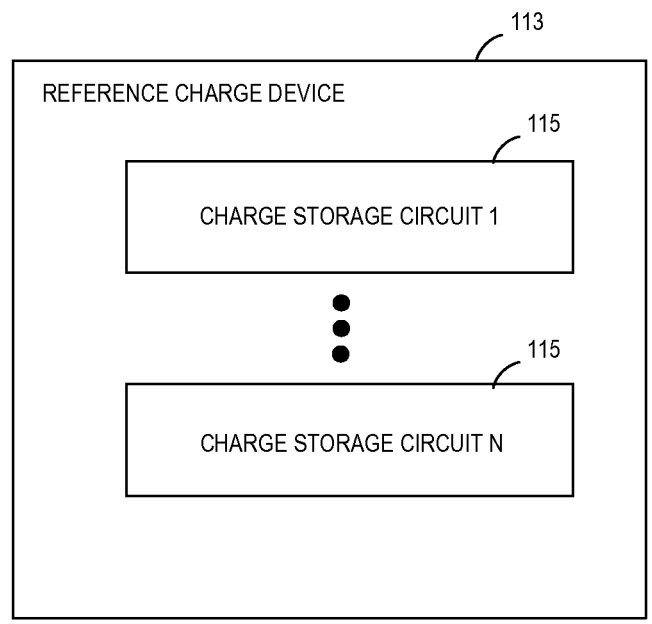
FIG. 2C is a block diagram of an embodiment of the reference charge device illustrated in FIGS. 2A and 2B.

Referring to FIG. 2C, the reference charge device 113 may be a single charge storage circuit 115, such as a capacitor or transistor circuit or other charge trap device, or the reference charge device may include multiple charge storage circuits, each charge storage circuit 115 having a different capacity for holding charge. Each charge storage circuit 115 may be fabricated to achieve a charge loss profile related to the properties of the memory cells in the non-volatile memory. In the simplest case, the reference charge device 113 includes a single charge storage circuit (e.g. a transistor on a non-volatile memory die 104 or the controller 102) calibrated to exhibit the same loss of charge behaviour as the data storage memory cells in the non-volatile memory. The charge loss may be calibrated to estimate elapsed Kelvin time as described below. This single circuit 115 can be fabricated physically larger than individual stored charge devices (e.g. NAND memory cells) within the memory die 104 or within the controller 102 so as to make it have more consistent charge leakage behaviour. This improved consistency over and above that which can be obtained from the memory may provide greater accuracy to estimate data retention problems in the memory system 100. Being separate from the memory cells, a reference charge device 113 it can be tuned for its specific role, that of estimating elapsed time, temperature cycling or both. A number of reference charge devices 113 can be embedded within the controller 102 or memory with each tuned to a specific behaviour to allow accurate correlation of specific elapsed period(s) over known temperature ranges.

Referring again to the modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM and ROM may be located both within the controller 102 and outside the controller 102. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. The controller 102 may be implemented in a single integrated circuit chip and may communicate with the different layers of memory in the non-volatile memory die 104 over one or more command channels. Controller executable code for implementing memory management instructions such as described herein may be stored in the non-volatile flash memory.

Additionally, one or more of the non-volatile memory die 104 may include a reference charge device 113 as describe above. The reference charge device 113 may include a single charge storage circuit 115, or multiple charge storage circuits of different charge storage capacities. Also, in different embodiments a reference charge device 113 may only be located in the non-volatile memory die 104 and not in the controller, may be in both of the non-volatile memory die and the controller, or may only be in the controller. In embodiments where a reference charge device is present in both the controller 102 and the non-volatile memory die 104, charge loss measurements taken by the Kelvin time management module from both reference charge devices 113 may be used together to determine a charge loss or bit error rate (BER) for the non-volatile memory system 100.

Figure 3:
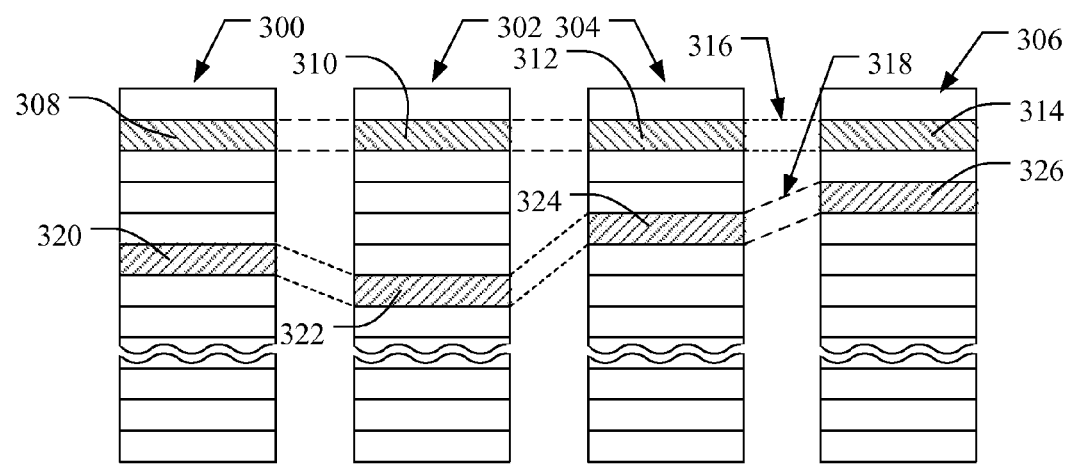
FIG. 3 illustrates an example physical memory organization of the non-volatile memory system of FIG. 1A.

The non-volatile flash memory array 142 in each die 104 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 3, a conceptual illustration of a representative flash memory cell array is shown. Four planes or sub-arrays 300, 302, 304 and 306 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
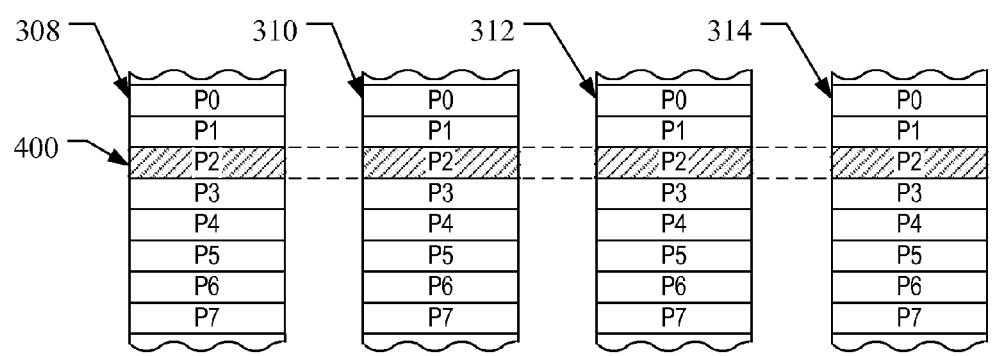
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312, and 314, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 400 is illustrated in FIG. 4 as formed of one physical page for each of the four blocks 308, 310, 312 and 314. The metapage 400 includes the page P2 in each of the four blocks but the pages of a metapage need not necessarily have the same relative position within each of the blocks. A metapage is the maximum unit of programming. The blocks disclosed in FIGS. 3-4 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host. The LBAs are then mapped to one or more physical blocks in the non-volatile memory system 100 where the data is physically stored.

Utilizing a memory system 100 such as disclosed above, with one or both of the controller 102 and non-volatile memory die having a reference charge device 113 as described, a method is now described for proactively determining a data retention status of the memory system and refreshing memory cells to avoid data loss due to elapsed time and/or temperature cycling.

At any moment, the integrity of data in a block may be impacted by any combination of wear, retention loss, read disturb or a presence of bad cells. Data retention may be affected by elapsed time and/or temperature variations while a memory device is powered off or while the memory device is powered on. Being able to measure data retention loss independently from wear, read disturb and other phenomena may provide improved memory analytics. In particular, it may be desirable to measure/predict memory data retention (DR) without having to read the data in the memory cells. Accordingly, rather than relying on reading data from memory cells to calculate BER, an independent measurement that does not involve reading data or measuring voltages of the memory cells directly may be made for elapsed Kelvin time. Pre-emptive action at the appropriate time, based on the independent voltage measurements of one or more reference charge devices 113 separate from the memory cells described herein, may lead to improved memory management and data management.

A retention capability may be predicted at any given program/erase (P/E) cycle, from a measurement of the loss of charge in one of the one or more charge storage devices 115 of a reference charge device 113. DR predictions may be used for block leveling, recovering wasted margins, extending endurance, and for other product capabilities. Periodic measurements of stored data can be used to dynamically determine the wear or retention loss rates of individual blocks.

For a given semiconductor non-volatile memory device, the profile of measured ambient temperature of the device itself over time can be used to quantify a rate of data loss in memory cells of the non-volatile memory device. However, if time is not being tracked and the temperature profile is not being recorded, the typical method for determining data loss is to measure actual data loss by checking bit error rates in the stored data. Directly measuring bit error rates of cells may introduce read disturb problems and also takes time. The delay due to measuring bit error rates directly from the cells, and the potential additional data loss from read disturb effects in making that measurement, may increase the possibility of missing the accumulated BER level that is still correctable by the ECC engine 124 available on the non-volatile memory system 100.

Figure 5:
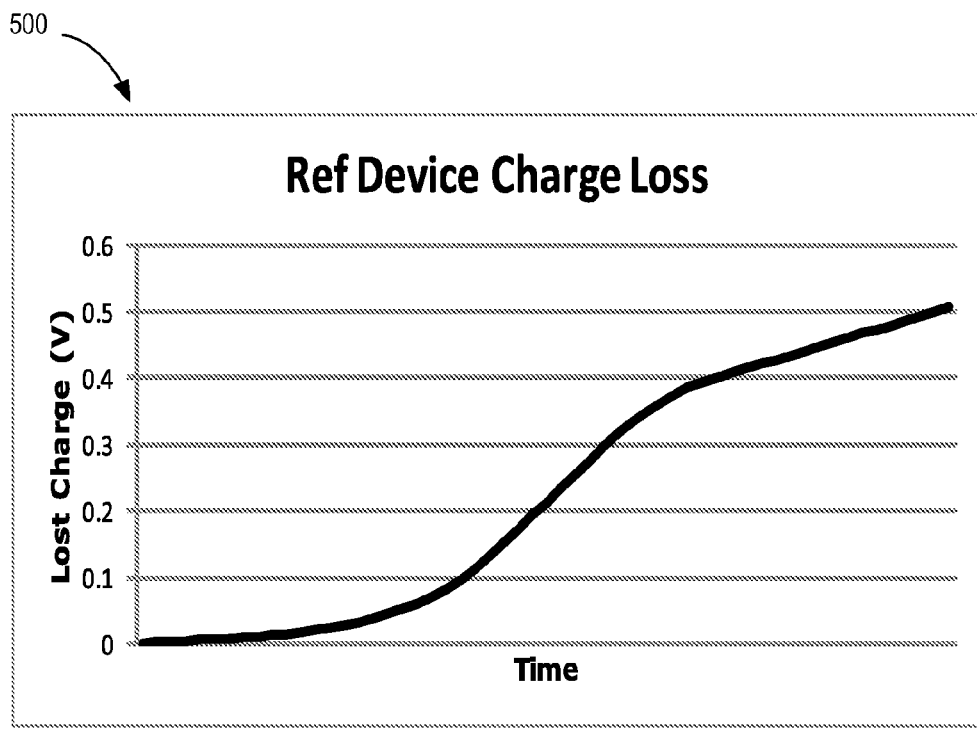
FIG. 5 is a graph of a hypothetical charge loss curve for a reference charge device illustrating charge loss versus time.
Figure 6:
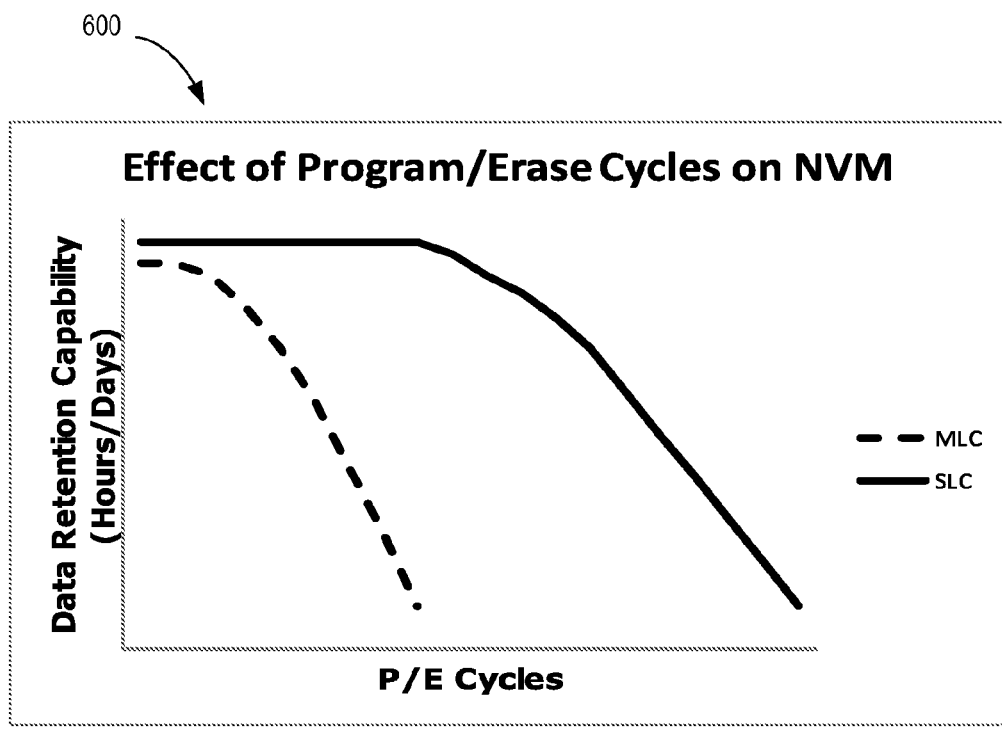
FIG. 6 is a graph of a hypothetical example effect of program and erase cycles on different non-volatile memory cell types illustrating data retention capability versus program/erase cycles.
Figure 7:
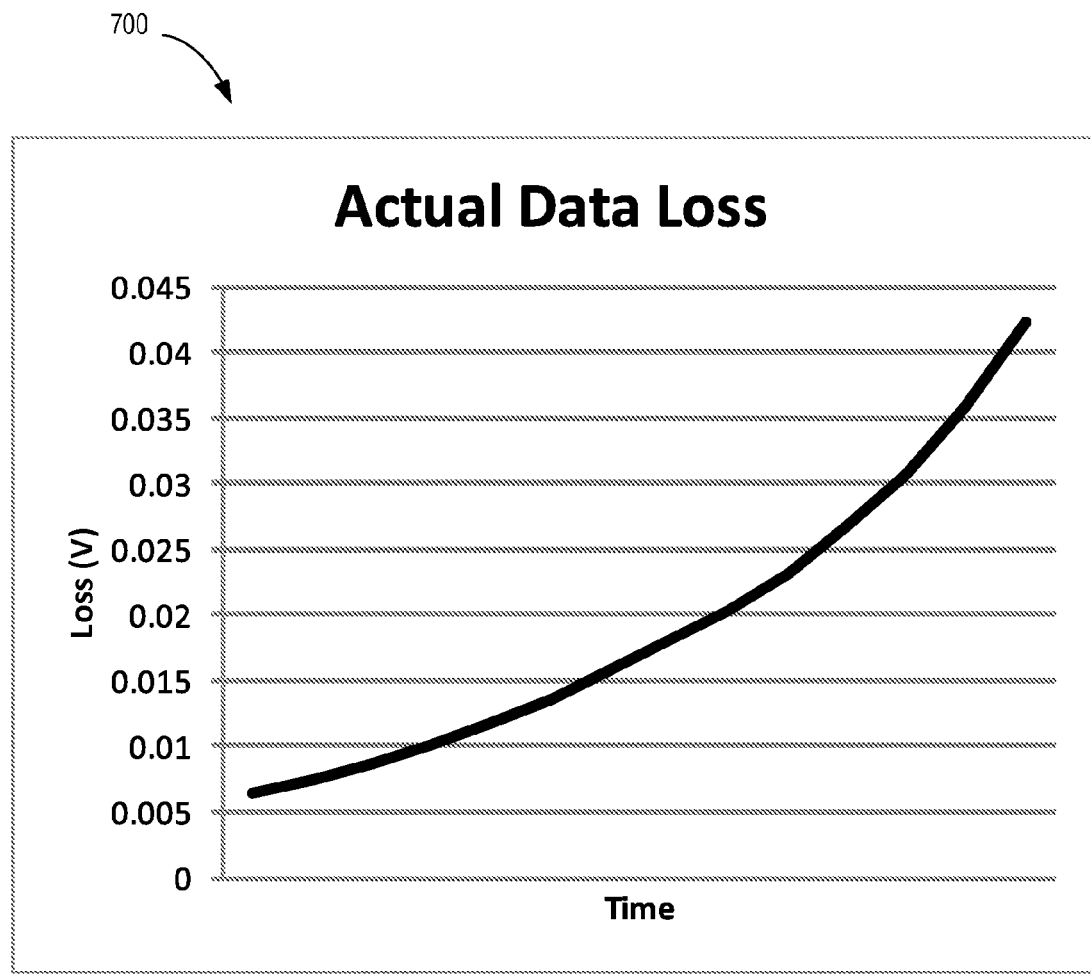
FIG. 7 is a graph of hypothetical actual data loss curve for a storage system illustrating voltage loss detected at a reference charge device over time.

Referring to FIG. 5, a reference charge device charge loss chart 500 of charge loss over time may be correlated to a time and temperature profile for a particular type of storage device such that a measure of charge loss (in volts) of the reference charge device from a known initial charge may be directly correlated with the data loss that the non-volatile memory of the storage device has experienced. Additionally, a reference charge device 113 that is separate from the memory cells of the non-volatile memory may avoid the problem of program and erase (P/E) degradation that affects the memory cells in addition to the time and temperature variables. The charge storage device(s) in the reference charge device may be fabricated as having greater charge storage capacity than the memory cells and, in conjunction with known SLC and MLC P/E degradation patterns for the particular storage device, a hypothetical example chart 600 of which is shown in FIG. 6, an actual data loss relationship of charge loss to time may be determined for the device. FIG. 7 illustrates a hypothetical charge loss versus time chart 700, for one of the SLC or MLC curves of FIG. 6, combining the aspects of the known temperature versus time profile for the non-volatile memory and the known P/E degradation of the memory. The actual loss curve, such as the hypothetical example of FIG. 7, may then be quantified in a table or a mathematical relation that is predetermined for the type of storage device. The Kelvin time management module 112 may utilize the predetermined table or mathematical relation representing the data loss pattern associated with the non-volatile memory system to calculate an estimated bit error rate (BER) that may then be compared to the ECC capabilities of the device to decide whether blocks of cells need to be refreshed to avoid data loss. Thus, the temperature accelerated stress time is measured and translated into an increase in BER via the data management module 112.

Figure 8:
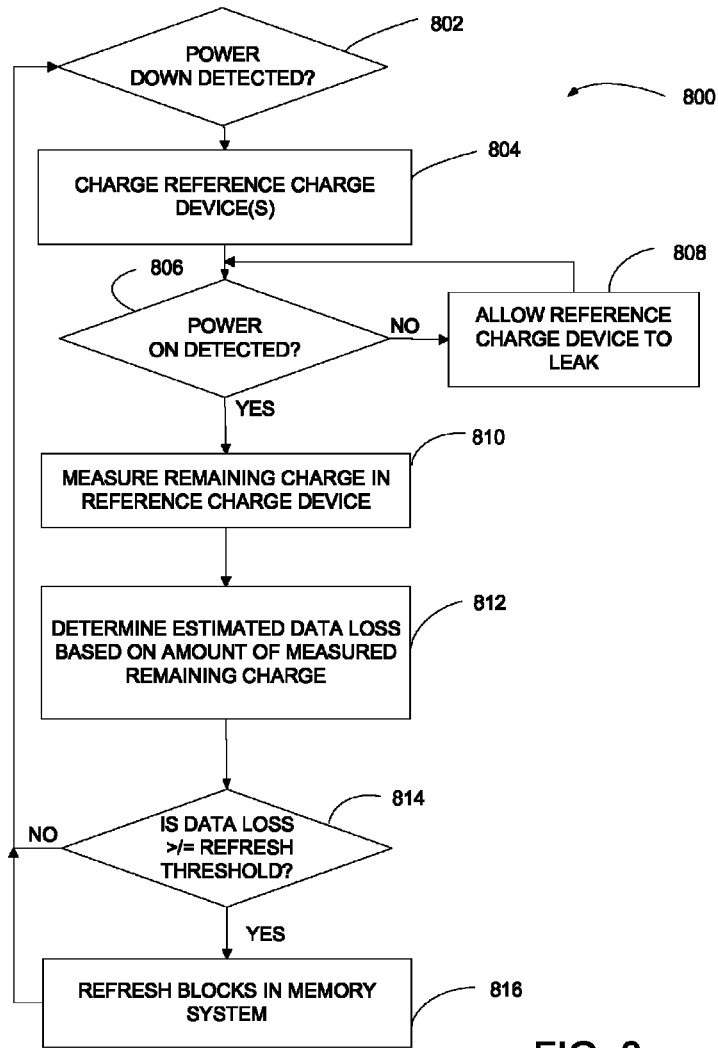
FIG. 8 is a flow diagram illustrating an embodiment of a method for estimating data loss using a reference charge device such as shown in FIGS. 2A-2C.

Referring to FIG. 8, a flow chart of a method of a Kelvin time management module utilizing a reference charge device 113 to determine and manage data loss is shown. The embodiment of FIG. 8 relates to process that the memory system utilizes a reference charge device 113 to track and later adjust for data degradation that occurred while the memory system is powered down. When a power down event is detected at the storage system (at 802), the controller 102, via the Kelvin time management module 112, causes the reference charge device 113 to be fully charged to its predetermined charge capacity (at 804) before the storage system fully powers down. In alternative embodiments, to account for possible unexpected power down situations where the storage system loses power unexpectedly without a normal power down sequence, the Kelvin time management module 112 may periodically charge the reference charge device 113 during normal use of the storage system. The reference charge device 113 will then lose charge while the memory system 100 remains in the powered down state (at 808). The Kelvin time management module 112, upon detecting a power on event (at 806), will then measure remaining charge in the reference charge device 113 (at 810) and determine an estimated data loss in the non-volatile memory corresponding to the voltage remaining in the reference charge device 113.

As noted above, the Kelvin time management module 112 may store locally, or retrieve from another location in the storage system, a predetermined table of data loss to reference charge device charge loss values, or a mathematical relation that converts the measured drop in the voltage stored on the reference charge device to a data loss value (at 812). The data loss may be in the form a BER estimation and the BER estimation may then be compared to a predetermined BER threshold by the controller 102 to decide whether enough potential data loss has occurred that a data refresh is needed in the non-volatile memory. For example, if the storage system employs an error correction code algorithm that can correct a given number of bits then a BER threshold lower than the BER that the ECC engine can correct for may be set to refresh the data before any non-recoverable data loss occurs. Assuming that the estimated BER determined from the Reference charge device voltage drop is less than the BER threshold (at 814), then the non-volatile memory in the non-volatile memory die 104 will not be refreshed. The process of waiting for an indication of power down, charging the reference charge device at power down and then measuring upon power up the charge loss on the reference charge device will repeat.

Alternatively, if the estimated BER from the measured drop in charge on the reference charge device 113 equals or exceeds the predetermined threshold, then the Kelvin time management module 112 can cause the controller 102 to refresh the non-volatile memory die (at 814, 816). Refreshing the non-volatile memory may consist of the Kelvin time management module 112 causing data to be re-written to different non-volatile memory blocks from the current blocks storing the data so that the ECC engine 124 of the controller 102 will automatically operate to fix accumulated errors in the non-volatile memory during the process of re-writing the data. In one embodiment, the controller would refresh only those blocks of cells currently at the greatest risk of ECC failure, where blocks at greatest risk of ECC failure may refer to blocks that are closest to reaching a maximum number of bits that the ECC engine 124 is capable of correcting.

The controller may select blocks of memory cells in the storage system as being at greatest risk of ECC failure based on any of a number of criteria. In one implementation, the risk of ECC failure may be based on the number of program/erase cycles for each block. For example, a fixed number of blocks having the highest program/erase counts, or any blocks having a program/erase count above a predetermined threshold, may be deemed to be at the greatest risk of ECC failure and therefore refreshed based on the estimated BER determined by the Kelvin time management module meeting or exceeding a particular threshold. Alternatively, or in combination, the controller may utilize initial BER of blocks before power down to determine which blocks are to be refreshed when the estimated BER from the Kelvin time management module reaches a predetermined level. The controller 102 may track and store P/E cycles for blocks and/or BER before power down for blocks, and use this stored information in conjunction with the disclosed process for determining temperature accelerated stress time to estimate how close blocks are to potentially losing data. The ones identified as at greatest risk of ECC failure, as defined above, may then be refreshed by writing the data from the identified blocks into new blocks.

In an alternative embodiment, when the reference charge device 113 includes multiple separate charge storage circuits 115 and each charge storage circuit is of a different size (i.e. charge storage capacity), the process of FIG. 8 may be modified to provide more accuracy in determining charge loss for a greater range of elapsed time periods or temperature cycling while the storage device is powered down. For example, if each charge storage circuit 115 in the reference charge device 113 is configured with a different charge storage capacity or other characteristic that leads to some charge storage circuits having a faster charge leakage profile than others, then the Kelvin time data management module 112 would select the charge storage circuit 115 in the reference charge device 113 that provides the highest resolution of charge loss information.

In a simple example of a two charge storage circuit 115 reference charge device 113, a first of the two charge storage circuits may be configured for a very slow leakage rate so that sufficient charge remains on the first charge storage circuit after an extended time that data loss may be estimated and corrected after longer power down times of the storage system. A second of the two charge storage circuits may be configured for a much faster leakage rate or a smaller charge capacity so that the second charge storage circuit would discharge to a point that is not readily measurable well before the first charge storage circuit loses its charge. Thus, the Kelvin time data management module would, in this embodiment, select the best charge storage circuit to provide a useful reading for estimating the data loss in the non-volatile memory. For shorter duration power off times and/or minimal temperature changes, when the charge loss on the first charge storage circuit is very slight and may not provide the resolution necessary to calculate an accurate estimated data BER, the second charge storage circuit may provide a better measure because it will discharge more rapidly to provide a greater measureable voltage drop. In contrast, for longer durations between charging and measuring of the reference charge device, and/or for significant temperature cycling, the second charge storage circuit may have fully discharged or discharged to a point that is not reliable, while the first charge storage circuit still retains a readable voltage. The first charge storage circuit would be selected over the second charge storage circuit for use in estimating the data loss condition for the memory system in the latter situation.

Referring to the example of FIG. 8, which illustrates a general process of using a reference charge device to estimate data loss, the differences to the process added by using a reference charge device 113 with multiple storage circuits 115 would include charging each of the charge storage circuits to its respective predetermined fully charged state when a power down condition is detected (at 804). Also, the step of measuring the remaining charge would be modified to selecting one of the charge storage circuits 115 for use in determining the estimated BER by using the measured remaining charge on the charge storage circuit 115 having the greatest drop in charge. Various alternative parameters for selecting the desired one of the charge storage circuits may include selecting the charge storage circuits having a remaining charge closest to a halfway charged state for the charge storage circuit 115, or any of a number of other predetermined selection algorithms. The voltage or charge drop of only the selected charge storage circuit may then be used for the reminder of the process set out in FIG. 8. In yet other alternative embodiments, more than one charge storage circuit in one reference charge device, or different combinations of charge storage circuits in multiple reference charge devices may be used to average or weight a BER or other data loss measurement used in comparing to a threshold for refreshing the non-volatile memory.

Figure 9:
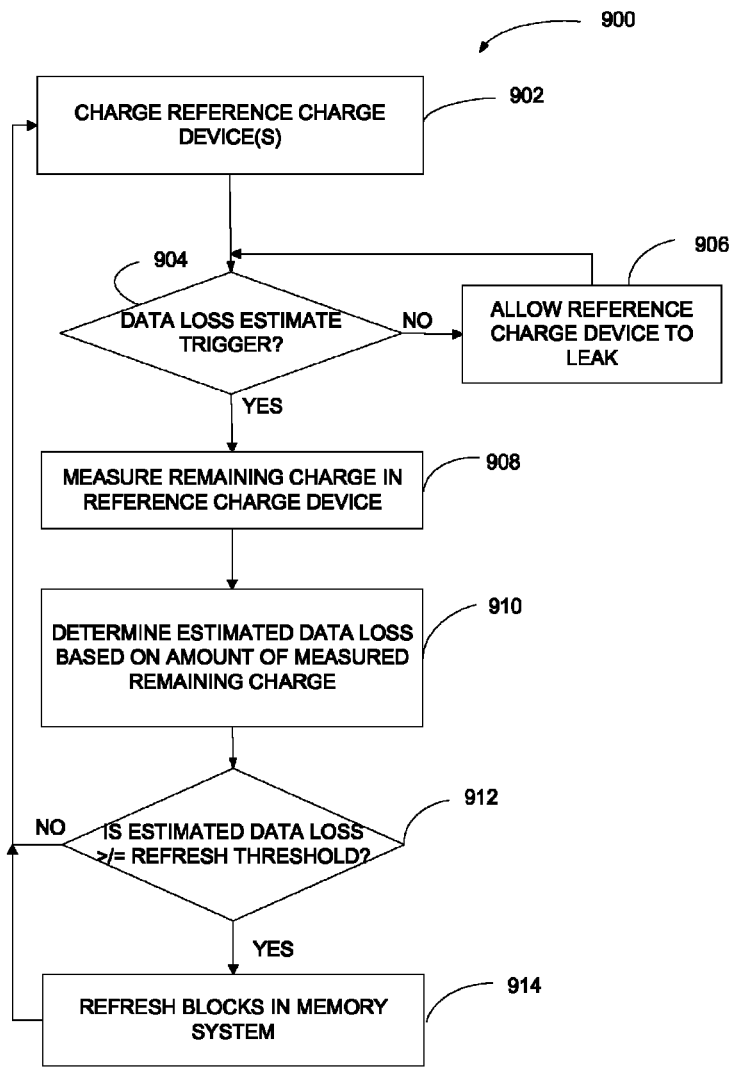
FIG. 9 is a flow diagram illustrating an alternative embodiment of the method of FIG. 8.

The example of FIG. 8 provides an example of using a reference voltage device for estimating data loss for periods of time when the memory system is powered down. The same principles of using a reference voltage device 113 rather than reading data from the memory cells in the non-volatile memory may be used to estimate data loss and refresh memory cells for periods of time while the memory system is powered on. For example, as shown in process 900 of FIG. 9, the Kelvin time management module 112 of the controller 102 may be configured to automatically charge the reference charge device or devices while the memory system is powered up (at 902) and then measure a charge storage circuit 115 in one or more reference charge devices 113 if a data loss estimate trigger is identified (at 904, 906). If a data loss estimate trigger is not identified, the reference charge device is left alone and allowed to leak charge as it has been designed to do. Each time a data loss estimate trigger is detected, the Kelvin time management module 112 causes a reference charge device charge to be measured and estimates the amount of data degradation in the non-volatile memory in the same manner noted above for the power down data loss estimate process 800 of FIG. 8 (at 908, 910). If the estimated data loss is at or above a predetermined threshold, then the blocks of memory cells in the non-volatile memory of the memory system 100 will be refreshed (at 912, 914). Selection of a portion or all of the blocks for refreshing may be accomplished in the same manner as described above with respect to FIG. 8. The data loss estimate trigger for the embodiment of FIG. 9 may be any of a number of trigger events. In one embodiment, the trigger may be the expiration of a timer maintained by the Kelvin time management module 112 that is set to a predetermined amount of elapsed time and that continually resets and triggers the data loss estimate measurement and recharging of the reference charge device at that predetermined interval. In other embodiments, the trigger may be based on a number of data operations, for example program and erase cycles, that have been completed. The trigger may include just one, or a combination, of these or other factors. Also, the memory system 100 may be configured to execute only one of the power down data loss estimation process of FIG. 8 and power on data loss estimation process of FIG. 9, or may be configured to execute both processes.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

As has been described in greater detail above, rather than attempt to measure actual elapsed time that has passed since a non-volatile memory device was last powered on, or to scan the underlying non-volatile memory cells for effects from time that has elapsed and/or take a series of temperature readings, one or more separate stored charge devices are used. These stored charge devices can be either within the controller or embedded with the memory itself or in both. The stored charge devices are designed such that they leak charge in a manner that is correlated to the behavior of the underlying non-volatile memory. By separating the Kelvin Time detection cells (i.e. the reference charge devices 113) from data storage cells, the effect of any program/erase cycles may be separated from the effect of charge leakage from elapsed time or temperature cycles while the non-volatile memory is powered down.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

I claim:

1. A method for predicting data retention loss comprising:
storing an electric charge on a charge storage device in a memory system having a plurality of non-volatile memory cells, the charge storage device being separate from the plurality of non-volatile memory cells and having a predetermined rate of charge loss;
periodically measuring an amount of charge loss in the charge storage device; and
determining a data loss level for the plurality of non-volatile memory cells in the non-volatile memory system based on the amount of charge loss in the charge storage device without reading data from the plurality of non-volatile memory cells.

2. The method of claim 1, wherein determining the data loss level comprises determining an estimated bit error rate for the plurality of non-volatile memory cells.

3. The method of claim 1 wherein the non-volatile memory system comprises a three-dimensional (3D) memory configuration.

4. The method of claim 1, further comprising refreshing at least a portion of the plurality of non-volatile memory cells in the memory in response to the determined data loss level reaching a predetermined threshold.

5. The method of claim 1, wherein the charge storage device comprises a plurality of charge storage circuits, each of the plurality of charge storage circuits having a different predetermined rate of charge loss, and wherein periodically measuring the amount of charge loss comprises:
selecting a charge storage circuit from the plurality of charge storage circuits;
measuring the amount of charge loss in the selected charge storage circuit; and
determining the data loss level for the plurality of non-volatile memory cells based on the measured amount of charge loss in the selected charge storage circuit.

6. The method of claim 5, wherein selecting the charge storage circuit comprises selecting from the plurality of charge storage circuits the charge storage circuit having a least amount of measureable charge remaining.

7. The method of claim 1, wherein periodically measuring an amount of charge loss in the charge storage device comprises measuring the amount of charge loss in response to detecting a power on operation at the non-volatile memory system.

8. The method of claim 5, wherein the data loss level comprises an estimated bit error rate, and wherein determining the data loss level comprises comparing the measured amount of charge loss to a predetermined estimate bit error rate for the non-volatile memory system.

9. A method for predicting data retention loss comprising:
in response to detecting a power down operation at a non-volatile memory system having a plurality of memory cells, charging a charge storage device in the non-volatile memory system to a fully charged state, the charge storage device being separate from the plurality of memory cells in the non-volatile memory system and having a predetermined rate of charge loss;
upon a power up of the non-volatile memory system, measuring an amount of charge loss at the charge storage device, the amount of charge loss corresponding to a difference between the fully charged state and a state of charge detected at the power up; and
estimating a bit error rate for the memory cells based on the measured amount of charge loss at the charge storage device.

10. The method of claim 9, wherein the charge storage device comprises a plurality of charge storage circuits, each of the plurality of charge storage circuits having a different predetermined rate of charge loss, and wherein periodically measuring the amount of charge loss comprises:
selecting a charge storage circuit from the plurality of charge storage circuits;
measuring the amount of charge loss in the selected charge storage circuit; and
determining the data loss level for the plurality of memory cells based on the measured amount of charge loss in the selected charge storage circuit.

11. The method of claim 10, wherein selecting the charge storage circuit comprises selecting from the plurality of charge storage circuits the charge storage circuit having a least amount of measureable charge remaining.

12. The method of claim 9, further comprising refreshing the memory cells in the memory in response to the estimated bit error rate reaching a predetermined threshold.

13. A non-volatile memory system comprising:
a non-volatile memory having a plurality of non-volatile memory cells;
a reference charge device having at least one charge storage circuit configured to leak a charge stored on the reference charge device at a predetermined rate; and
a controller in communication with non-volatile memory and the reference charge device, the controller configured to:
charge the reference charge device to a fully charged condition;
measure a remaining charge on the charge storage device in response to detecting a data loss measurement trigger;
estimate a data loss condition of the non-volatile memory based on the measured remaining charge independent of reading any data from the non-volatile memory; and
refresh at least a portion of the plurality of non-volatile memory cells in the non-volatile memory when the estimated data loss condition satisfies a predetermined threshold.

14. The memory system of claim 13, wherein the reference charge device is positioned in the controller.

15. The memory system of claim 13, wherein the reference charge device is positioned on a non-volatile memory die in the non-volatile memory.

16. The memory system of claim 13, wherein the reference charge device comprises a plurality of charge storage circuits, each of the plurality of charge storage circuits having a different charge capacity.

17. The memory system of claim 13, wherein the reference charge device comprises a plurality of reference charge devices, and wherein a first of the plurality of reference charge devices is positioned in the controller and a second of the plurality of reference charge devices is positioned in a non-volatile memory die of the non-volatile memory.

18. The memory system of claim 13, wherein the controller is configured to only charge the reference charge device during a power down operation, and wherein the data loss measurement trigger comprises a power up operation of the memory system.

19. The memory system of claim 13, wherein the data loss measurement trigger comprises an elapsed time.

20. The memory system of claim 13, wherein the charge storage device comprises a plurality of charge storage circuits, each of the plurality of charge storage circuits configured with a different predetermined rate of charge loss.

21. The memory system of claim 20, wherein to measure the remaining charge on the charge storage device the controller is configured to:
select a charge storage circuit from the plurality of charge storage circuits; and
measure the amount of charge loss in only the selected charge storage circuit.

22. The memory system of claim 21, wherein the controller is configured to select the charge storage circuit having a least amount of measureable charge remaining.

23. The memory system of claim 13, wherein the non-volatile memory comprises a three-dimensional (3D) memory configuration.

* * * * *